United States Patent

Manssen et al.

(10) Patent No.: US 8,620,236 B2
(45) Date of Patent: *Dec. 31, 2013

(54) TECHNIQUES FOR IMPROVED ADAPTIVE IMPEDANCE MATCHING

(75) Inventors: Keith R. Manssen, Bull Valley, IL (US); Matthew R. Greene, Crystal Lake, IL (US); Wayne E. Smith, Crystal Lake, IL (US); Guillaume Blin, Malden, MA (US)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/887,467

(22) Filed: Sep. 21, 2010

(65) Prior Publication Data

US 2011/0014886 A1  Jan. 20, 2011

Related U.S. Application Data

(63) Continuation of application No. 11/789,015, filed on Apr. 23, 2007, now Pat. No. 7,917,104.

(51) Int. Cl.
*H01Q 11/12* (2006.01)
*H04B 1/04* (2006.01)
*H03G 3/30* (2006.01)

(52) U.S. Cl.
CPC ............ *H04B 1/0458* (2013.01); *H03G 3/3042* (2013.01)
USPC ........... 455/121; 455/120; 455/123; 455/126; 455/115.1

(58) Field of Classification Search
USPC ................ 455/115.1, 121, 123, 125, 126
See application file for complete search history.

(56) References Cited

U.S. PATENT DOCUMENTS

| | | | |
|---|---|---|---|
| 2,745,067 A | 5/1956 | True | |
| 3,117,279 A | 1/1964 | Ludvigson | |
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |
| 3,571,716 A | 3/1971 | Hill | |
| 3,590,385 A | 6/1971 | Sabo | |
| 3,601,717 A | 8/1971 | Kuecken | |
| 3,742,279 A | 6/1973 | Kupsky | |

(Continued)

FOREIGN PATENT DOCUMENTS

| | | | |
|---|---|---|---|
| DE | 19614655 | 10/1997 | ............ H03H 11/30 |
| DE | 102008050 | 4/2010 | |

(Continued)

OTHER PUBLICATIONS

Patent Cooperation Treaty, "International Search Report and Written Opinion", ISA/US, by Officer Blaine Copenheaver in PCT Application No. PCT/US08/005085; Document of 9 pages dated Jul. 2, 2008.

(Continued)

*Primary Examiner* — Duc M Nguyen
(74) *Attorney, Agent, or Firm* — Guntin & Gust, PLC; Andrew Gust

(57) ABSTRACT

An embodiment of the present invention provides a method for limiting tuning of a matching network having variable reactive elements coupled to a variable load impedance to at least reduce an undesirable effect caused by an RF signal. Other embodiments are disclosed.

29 Claims, 3 Drawing Sheets

(56) References Cited

U.S. PATENT DOCUMENTS

| | | | |
|---|---|---|---|
| 3,794,941 | A | 2/1974 | Templin |
| 3,919,644 | A | 11/1975 | Smolka |
| 3,990,024 | A | 11/1976 | Hou |
| 3,995,237 | A | 11/1976 | Brunner |
| 4,186,359 | A | 1/1980 | Kaegebein |
| 4,201,960 | A | 5/1980 | Skutta |
| 4,227,256 | A | 10/1980 | O'Keefe |
| 4,383,441 | A | 5/1983 | Willis |
| 4,476,578 | A | 10/1984 | Gaudin |
| 4,493,112 | A | 1/1985 | Bruene |
| 4,777,490 | A | 10/1988 | Sharma |
| 4,799,066 | A | 1/1989 | Deacon |
| 4,965,607 | A | 10/1990 | Wilkins |
| 4,980,656 | A | 12/1990 | Duffalo |
| 5,032,805 | A | 7/1991 | Elmer |
| 5,136,478 | A | 8/1992 | Bruder |
| 5,142,255 | A | 8/1992 | Chang |
| 5,177,670 | A | 1/1993 | Shinohara |
| 5,195,045 | A | 3/1993 | Keane |
| 5,200,826 | A | 4/1993 | Seong |
| 5,212,463 | A | 5/1993 | Babbitt |
| 5,243,358 | A | 9/1993 | Sanford |
| 5,258,728 | A | 11/1993 | Taniyoshi |
| 5,276,912 | A | 1/1994 | Siwiak |
| 5,301,358 | A | 4/1994 | Gaskill |
| 5,307,033 | A | 4/1994 | Koscica |
| 5,310,358 | A | 5/1994 | Johnson |
| 5,312,790 | A | 5/1994 | Sengupta |
| 5,334,958 | A | 8/1994 | Babbitt |
| 5,371,473 | A | 12/1994 | Trinh |
| 5,409,889 | A | 4/1995 | Das |
| 5,427,988 | A | 6/1995 | Sengupta |
| 5,430,417 | A | 7/1995 | Martin |
| 5,446,447 | A | 8/1995 | Carney |
| 5,448,252 | A | 9/1995 | Ali |
| 5,451,567 | A | 9/1995 | Das |
| 5,451,914 | A | 9/1995 | Stengel |
| 5,457,394 | A | 10/1995 | McEwan |
| 5,472,935 | A | 12/1995 | Yandrofski |
| 5,479,139 | A | 12/1995 | Koscica |
| 5,486,491 | A | 1/1996 | Sengupta |
| 5,496,795 | A | 3/1996 | Das |
| 5,502,372 | A | 3/1996 | Quan |
| 5,524,281 | A | 6/1996 | Bradley |
| 5,548,837 | A | 8/1996 | Hess et al. |
| 5,561,407 | A | 10/1996 | Koscica |
| 5,564,086 | A * | 10/1996 | Cygan et al. ............... 455/126 |
| 5,589,844 | A | 12/1996 | Belcher et al. |
| 5,593,495 | A | 1/1997 | Masuda |
| 5,635,433 | A | 6/1997 | Sengupta |
| 5,635,434 | A | 6/1997 | Sengupta |
| 5,640,042 | A | 6/1997 | Koscica |
| 5,679,624 | A | 10/1997 | Das |
| 5,689,219 | A | 11/1997 | Piirainen |
| 5,693,429 | A | 12/1997 | Sengupta |
| 5,694,134 | A | 12/1997 | Barnes |
| 5,699,071 | A | 12/1997 | Urakami |
| 5,721,194 | A | 2/1998 | Yandrofski |
| 5,766,697 | A | 6/1998 | Sengupta |
| 5,777,581 | A | 7/1998 | Lilly |
| 5,778,308 | A * | 7/1998 | Sroka et al. ............... 455/115.1 |
| 5,786,727 | A | 7/1998 | Sigmon |
| 5,812,572 | A | 9/1998 | King |
| 5,812,943 | A | 9/1998 | Suzuki |
| 5,830,591 | A | 11/1998 | Sengupta |
| 5,846,893 | A | 12/1998 | Sengupta |
| 5,874,926 | A | 2/1999 | Tsuru |
| 5,880,635 | A * | 3/1999 | Satoh ............... 330/144 |
| 5,886,867 | A | 3/1999 | Chivukula |
| 5,892,482 | A | 4/1999 | Coleman et al. |
| 5,929,717 | A | 7/1999 | Richardson |
| 5,963,871 | A | 10/1999 | Zhinong |
| 5,969,582 | A | 10/1999 | Boesch |
| 5,982,099 | A | 11/1999 | Barnes et al. |
| 5,990,766 | A | 11/1999 | Zhang |
| 6,009,124 | A | 12/1999 | Smith |
| 6,020,787 | A | 2/2000 | Kim |
| 6,020,795 | A | 2/2000 | Kim |
| 6,029,075 | A | 2/2000 | Das |
| 6,045,932 | A | 4/2000 | Jia |
| 6,061,025 | A | 5/2000 | Jackson |
| 6,074,971 | A | 6/2000 | Chiu |
| 6,096,127 | A | 8/2000 | Dimos |
| 6,100,733 | A | 8/2000 | Dortu |
| 6,101,102 | A | 8/2000 | Brand |
| 6,115,585 | A | 9/2000 | Matero |
| 6,133,883 | A | 10/2000 | Munson |
| 6,172,385 | B1 | 1/2001 | Duncombe |
| 6,215,644 | B1 | 4/2001 | Dhuler |
| 6,242,989 | B1 | 6/2001 | Barber |
| 6,281,748 | B1 | 8/2001 | Klomsdorf et al. |
| 6,281,847 | B1 | 8/2001 | Lee |
| 6,309,895 | B1 | 10/2001 | Jaing |
| 6,343,208 | B1 | 1/2002 | Ying |
| 6,377,142 | B1 | 4/2002 | Chiu |
| 6,377,217 | B1 | 4/2002 | Zhu |
| 6,377,440 | B1 | 4/2002 | Zhu |
| 6,384,785 | B1 | 5/2002 | Kamogawa |
| 6,404,614 | B1 | 6/2002 | Zhu |
| 6,408,190 | B1 | 6/2002 | Ying |
| 6,414,562 | B1 | 7/2002 | Bouisse et al. |
| 6,415,562 | B1 | 7/2002 | Donaghue |
| 6,452,776 | B1 | 9/2002 | Chakravorty |
| 6,461,930 | B2 | 10/2002 | Akram |
| 6,466,774 | B1 | 10/2002 | Okabe |
| 6,492,883 | B2 | 12/2002 | Liang |
| 6,514,895 | B1 | 2/2003 | Chiu |
| 6,525,630 | B1 | 2/2003 | Zhu |
| 6,531,936 | B1 | 3/2003 | Chiu |
| 6,535,076 | B2 | 3/2003 | Partridge |
| 6,535,722 | B1 | 3/2003 | Rosen |
| 6,538,603 | B1 | 3/2003 | Chen |
| 6,556,102 | B1 | 4/2003 | Sengupta |
| 6,556,814 | B1 * | 4/2003 | Klomsdorf et al. ............ 455/121 |
| 6,570,462 | B2 | 5/2003 | Edmonson |
| 6,590,468 | B2 | 7/2003 | Du Toit |
| 6,590,541 | B1 | 7/2003 | Schultze |
| 6,597,265 | B2 | 7/2003 | Liang |
| 6,608,603 | B2 | 8/2003 | Alexopoulos |
| 6,624,786 | B2 | 9/2003 | Boyle |
| 6,640,085 | B1 | 10/2003 | Chatzipetros |
| 6,657,595 | B1 | 12/2003 | Alameh |
| 6,661,638 | B2 | 12/2003 | Jackson et al. |
| 6,670,256 | B2 | 12/2003 | Yang |
| 6,710,651 | B2 | 3/2004 | Forrester |
| 6,724,611 | B1 | 4/2004 | Mosley |
| 6,724,890 | B1 | 4/2004 | Bareis |
| 6,737,179 | B2 | 5/2004 | Sengupta |
| 6,759,918 | B2 | 7/2004 | Du Toit |
| 6,765,540 | B2 | 7/2004 | Toncich |
| 6,768,472 | B2 | 7/2004 | Alexopoulos |
| 6,774,077 | B2 | 8/2004 | Sengupta |
| 6,795,712 | B1 | 9/2004 | Vakilian |
| 6,825,818 | B2 | 11/2004 | Toncich |
| 6,839,028 | B2 | 1/2005 | Lee |
| 6,845,126 | B2 | 1/2005 | Dent |
| 6,859,104 | B2 | 2/2005 | Toncich |
| 6,862,432 | B1 * | 3/2005 | Kim ............... 455/80 |
| 6,864,757 | B2 | 3/2005 | Du Toit |
| 6,868,260 | B2 | 3/2005 | Jagielski |
| 6,875,655 | B2 | 4/2005 | Lin |
| 6,888,714 | B2 | 5/2005 | Shaw |
| 6,905,989 | B2 | 6/2005 | Ellis |
| 6,907,234 | B2 | 6/2005 | Karr |
| 6,920,315 | B1 | 7/2005 | Wilcox |
| 6,922,330 | B2 | 7/2005 | Nielsen |
| 6,943,078 | B1 | 9/2005 | Zheng |
| 6,946,847 | B2 | 9/2005 | Nishimori |
| 6,949,442 | B2 | 9/2005 | Barth |
| 6,961,368 | B2 | 11/2005 | Dent |
| 6,964,296 | B2 | 11/2005 | Memory |
| 6,965,837 | B2 | 11/2005 | Vintola |
| 6,993,297 | B2 | 1/2006 | Smith |
| 6,999,297 | B1 | 2/2006 | Klee |

(56) References Cited

U.S. PATENT DOCUMENTS

| | | | |
|---|---|---|---|
| 7,009,455 B2 | 3/2006 | Toncich | |
| 7,071,776 B2 | 7/2006 | Forrester | |
| 7,106,715 B1* | 9/2006 | Kelton et al. | 370/338 |
| 7,107,033 B2 | 9/2006 | du Toit | |
| 7,113,614 B2 | 9/2006 | Rhoads | |
| 7,151,411 B2 | 12/2006 | Martin | |
| 7,176,634 B2 | 2/2007 | Kitamura | |
| 7,176,845 B2 | 2/2007 | Fabrega-Sanchez | |
| 7,180,467 B2 | 2/2007 | Fabrega-Sanchez | |
| 7,221,327 B2 | 5/2007 | Toncich | |
| 7,298,329 B2 | 11/2007 | Diament | |
| 7,312,118 B2 | 12/2007 | Kiyotoshi | |
| 7,332,980 B2 | 2/2008 | Zhu | |
| 7,332,981 B2 | 2/2008 | Matsuno | |
| 7,339,527 B2 | 3/2008 | Sager | |
| 7,369,828 B2 | 5/2008 | Shamsaifar | |
| 7,426,373 B2 | 9/2008 | Clingman | |
| 7,427,949 B2 | 9/2008 | Channabasappa et al. | |
| 7,468,638 B1 | 12/2008 | Tsai | |
| 7,531,011 B2 | 5/2009 | Yamasaki | |
| 7,535,080 B2 | 5/2009 | Zeng et al. | |
| 7,535,312 B2 | 5/2009 | McKinzie | |
| 7,539,527 B2 | 5/2009 | Jang | |
| 7,557,507 B2 | 7/2009 | Wu | |
| 7,596,357 B2 | 9/2009 | Nakamata | |
| 7,633,355 B2 | 12/2009 | Matsuo | |
| 7,655,530 B2 | 2/2010 | Hosking | |
| 7,667,663 B2 | 2/2010 | Hsiao | |
| 7,705,692 B2 | 4/2010 | Fukamachi et al. | |
| 7,711,337 B2 | 5/2010 | McKinzie | |
| 7,714,676 B2 | 5/2010 | McKinzie | |
| 7,714,678 B2 | 5/2010 | du Toit et al. | |
| 7,728,693 B2 | 6/2010 | du Toit et al. | |
| 7,768,400 B2 | 8/2010 | Lawrence et al. | |
| 7,786,819 B2 | 8/2010 | Ella | |
| 7,795,990 B2 | 9/2010 | du Toit | |
| 7,852,170 B2 | 12/2010 | McKinzie | |
| 7,865,154 B2 | 1/2011 | Mendolia | |
| 7,907,094 B2 | 3/2011 | Kakitsu et al. | |
| 7,917,104 B2 | 3/2011 | Manssen et al. | |
| 7,949,309 B2 | 5/2011 | Rofougaran | |
| 7,969,257 B2 | 6/2011 | du Toit | |
| 7,991,363 B2 | 8/2011 | Greene | |
| 8,008,982 B2 | 8/2011 | McKinzie | |
| 8,072,285 B2 | 12/2011 | Spears | |
| 8,112,043 B2 | 2/2012 | Knudsen et al. | |
| 8,170,510 B2 | 5/2012 | Knudsen et al. | |
| 8,190,109 B2 | 5/2012 | Ali et al. | |
| 8,204,446 B2 | 6/2012 | Scheer | |
| 8,217,732 B2 | 7/2012 | McKinzie | |
| 8,299,867 B2 | 10/2012 | McKinzie | |
| 8,320,850 B1 | 11/2012 | Khlat | |
| 2002/0008672 A1 | 1/2002 | Gothard et al. | |
| 2002/0030566 A1 | 3/2002 | Bozler | |
| 2002/0109642 A1 | 8/2002 | Gee et al. | |
| 2002/0118075 A1 | 8/2002 | Ohwada | |
| 2002/0145483 A1 | 10/2002 | Bouisse | |
| 2002/0167963 A1 | 11/2002 | Joa-Ng | |
| 2002/0187780 A1 | 12/2002 | Souissi | |
| 2002/0191703 A1 | 12/2002 | Ling | |
| 2002/0193088 A1 | 12/2002 | Jung | |
| 2003/0060227 A1 | 3/2003 | Sekine | |
| 2003/0071300 A1 | 4/2003 | Yashima | |
| 2003/0114124 A1 | 6/2003 | Higuchi | |
| 2003/0193997 A1 | 10/2003 | Dent | |
| 2003/0199286 A1 | 10/2003 | du Toit | |
| 2003/0210206 A1 | 11/2003 | Phillips | |
| 2003/0232607 A1 | 12/2003 | Le Bars et al. | |
| 2004/0009754 A1 | 1/2004 | Smith, Jr. | |
| 2004/0100341 A1 | 5/2004 | Luetzelschwab | |
| 2004/0127178 A1 | 7/2004 | Kuffner | |
| 2004/0137950 A1 | 7/2004 | Bolin | |
| 2004/0202399 A1 | 10/2004 | Kochergin | |
| 2004/0257293 A1 | 12/2004 | Friedrich | |
| 2005/0007291 A1 | 1/2005 | Fabrega-Sanchez | |
| 2005/0032488 A1 | 2/2005 | Pehlke | |
| 2005/0032541 A1* | 2/2005 | Wang et al. | 455/522 |
| 2005/0042994 A1 | 2/2005 | Otaka | |
| 2005/0059362 A1 | 3/2005 | Kalajo | |
| 2005/0082636 A1 | 4/2005 | Yashima | |
| 2005/0085204 A1 | 4/2005 | Poilasne et al. | |
| 2005/0093624 A1 | 5/2005 | Forrester | |
| 2005/0130608 A1 | 6/2005 | Forse | |
| 2005/0130699 A1 | 6/2005 | Kim | |
| 2005/0153671 A1* | 7/2005 | Ichikawa | 455/127.2 |
| 2005/0208960 A1* | 9/2005 | Hassan | 455/522 |
| 2005/0215204 A1 | 9/2005 | Wallace | |
| 2005/0282503 A1 | 12/2005 | Onno | |
| 2006/0003537 A1 | 1/2006 | Sinha | |
| 2006/0009165 A1 | 1/2006 | Alles | |
| 2006/0160501 A1 | 7/2006 | Mendolia | |
| 2006/0183433 A1 | 8/2006 | Mori et al. | |
| 2006/0183442 A1 | 8/2006 | Chang | |
| 2006/0205368 A1 | 9/2006 | Bustamante | |
| 2006/0281423 A1 | 12/2006 | Caimi | |
| 2007/0013483 A1 | 1/2007 | Stewart | |
| 2007/0035458 A1 | 2/2007 | Ohba | |
| 2007/0042725 A1 | 2/2007 | Poilasne | |
| 2007/0042734 A1 | 2/2007 | Ryu | |
| 2007/0063788 A1 | 3/2007 | Zhu | |
| 2007/0080888 A1 | 4/2007 | Mohamadi | |
| 2007/0082611 A1 | 4/2007 | Terranova et al. | |
| 2007/0085609 A1 | 4/2007 | Itkin | |
| 2007/0111681 A1* | 5/2007 | Alberth et al. | 455/127.1 |
| 2007/0142014 A1 | 6/2007 | Wilcox | |
| 2007/0149146 A1 | 6/2007 | Hwang | |
| 2007/0184825 A1 | 8/2007 | Lim et al. | |
| 2007/0194859 A1 | 8/2007 | Brobston | |
| 2007/0197180 A1 | 8/2007 | McKinzie | |
| 2007/0200766 A1 | 8/2007 | McKinzie | |
| 2007/0285326 A1 | 12/2007 | McKinzie | |
| 2008/0055016 A1 | 3/2008 | Morris | |
| 2008/0081670 A1 | 4/2008 | Rofougaran | |
| 2008/0106350 A1 | 5/2008 | McKinzie | |
| 2008/0122553 A1 | 5/2008 | McKinzie | |
| 2008/0122723 A1 | 5/2008 | Rofougaran | |
| 2008/0158076 A1 | 7/2008 | Walley | |
| 2008/0261544 A1 | 10/2008 | Blin | |
| 2008/0274706 A1 | 11/2008 | Blin | |
| 2008/0280570 A1 | 11/2008 | Blin | |
| 2008/0300027 A1 | 12/2008 | Dou et al. | |
| 2008/0305749 A1 | 12/2008 | Ben-Bassat | |
| 2009/0002077 A1 | 1/2009 | Rohani et al. | |
| 2009/0027286 A1 | 1/2009 | Ohishi | |
| 2009/0082017 A1 | 3/2009 | Chang et al. | |
| 2009/0109880 A1 | 4/2009 | Kim et al. | |
| 2009/0121963 A1 | 5/2009 | Greene | |
| 2009/0149136 A1 | 6/2009 | Rofougaran | |
| 2009/0180403 A1 | 7/2009 | Tudosoiu | |
| 2009/0184879 A1 | 7/2009 | Derneryd | |
| 2009/0215446 A1 | 8/2009 | Hapsari et al. | |
| 2009/0231220 A1 | 9/2009 | Zhang et al. | |
| 2009/0253385 A1 | 10/2009 | Dent et al. | |
| 2009/0264065 A1 | 10/2009 | Song | |
| 2009/0278685 A1 | 11/2009 | Potyrailo | |
| 2009/0323582 A1 | 12/2009 | Proctor et al. | |
| 2010/0041348 A1 | 2/2010 | Wilcox et al. | |
| 2010/0053009 A1 | 3/2010 | Rofougaran | |
| 2010/0073103 A1 | 3/2010 | Spears | |
| 2010/0085260 A1 | 4/2010 | McKinzie | |
| 2010/0105425 A1 | 4/2010 | Asokan | |
| 2010/0156552 A1 | 6/2010 | McKinzie | |
| 2010/0164640 A1 | 7/2010 | McKinzie | |
| 2010/0164641 A1 | 7/2010 | McKinzie | |
| 2010/0285836 A1 | 11/2010 | Horihata et al. | |
| 2010/0302106 A1 | 12/2010 | Knudsen et al. | |
| 2010/0304688 A1 | 12/2010 | Knudsen | |
| 2011/0012790 A1 | 1/2011 | Badaruzzaman | |
| 2011/0014879 A1 | 1/2011 | Alberth et al. | |
| 2011/0014886 A1 | 1/2011 | Manssen | |
| 2011/0043298 A1 | 2/2011 | McKinzie | |
| 2011/0053524 A1 | 3/2011 | Manssen | |
| 2011/0063042 A1 | 3/2011 | Mendolia | |
| 2011/0086600 A1 | 4/2011 | Muhammad | |

(56) References Cited

U.S. PATENT DOCUMENTS

| | | | |
|---|---|---|---|
| 2011/0086630 A1 | 4/2011 | Manssen |
| 2011/0105023 A1 | 5/2011 | Scheer et al. |
| 2011/0121079 A1 | 5/2011 | Lawrence et al. |
| 2011/0183628 A1 | 7/2011 | Baker |
| 2011/0183633 A1 | 7/2011 | Ohba et al. |
| 2011/0227666 A1 | 9/2011 | Manssen |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0299438 A1 | 12/2011 | Mikhemar |
| 2012/0075159 A1 | 3/2012 | Chang |
| 2012/0094708 A1 | 4/2012 | Park |
| 2012/0100802 A1 | 4/2012 | Mohebbi |
| 2012/0154975 A1 | 6/2012 | Oakes |
| 2012/0214421 A1 | 8/2012 | Hoirup |
| 2012/0243579 A1 | 9/2012 | Premakanthan et al. |
| 2012/0295554 A1 | 11/2012 | Greene |

FOREIGN PATENT DOCUMENTS

| | | | |
|---|---|---|---|
| EP | 0685936 | 12/1995 | ............ H03H 11/30 |
| EP | 09/09024 | 4/1999 | |
| EP | 0909024 | 4/1999 | |
| EP | 1079296 | 2/2001 | |
| EP | 1137192 | 9/2001 | |
| EP | 1298810 | 4/2003 | ............ H04B 1/38 |
| EP | 2328233 | 6/2011 | |
| JP | 02-077580 | 9/1991 | |
| JP | 03-276901 | 9/1991 | |
| JP | 9321526 | 12/1997 | |
| JP | 10209722 | 8/1998 | |
| JP | 2000124066 | 4/2000 | |
| KR | 100645526 | 11/2006 | |
| KR | 10-0740177 | 7/2007 | |
| WO | WO-01/71846 | 9/2001 | |
| WO | 2006/031170 | 3/2006 | |
| WO | WO-2008/030165 | 3/2008 | |
| WO | WO-2009/064968 | 5/2009 | |
| WO | WO-2009/155966 | 12/2009 | |
| WO | WO-2011/044592 | 4/2011 | |
| WO | 2011/084716 | 7/2011 | |
| WO | WO-2011/133657 | 10/2011 | |
| WO | WO-2011028453 | 10/2011 | |
| WO | 2012/085932 | 6/2012 | |

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

Du Toit, , "Tunable Microwave Devices With Auto Adjusting Matching Circuit", U.S. Appl. No. 13/302,617, filed Nov. 22, 2011.

Du Toit, , "Tunable Microwave Devices With Auto-Adjusting Matching Circuit", U.S. Appl. No. 13/302,649, filed Nov. 22, 2011.

Greene, , "Method and Apparatus for Tunning a Communication Device", U.S. Appl. No. 13/108,463, filed May 16, 2011.

Greene, , "Method and Apparatus for Tuning a Communication Device", U.S. Appl. No. 13/108,589, filed May 16, 2011.

Hoirup, , "Method and Apparatus for Radio Antenna Frequency Tuning", U.S. Appl. No. 13/030,177, filed Feb. 18, 2011.

Hyun, S. , "Effects of strain on the dielectric properties of tunable dielectric SrTi03 thin films", Applied Physics Letters, 2004 American Institute of Physics.

Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.

Manssen, , "Method and Apparatus for Managing Interference in a Communication Device", U.S. Appl. No. 61/326,206, filed Apr. 20, 2010.

Manssen, , "Method and Apparatus for Tunning Antennas in a Communication Device", U.S. Appl. No. 12/941,972, filed Nov. 8, 2010.

Manssen, , "Method and Apparatus for Tunning Antennas in a Communication Device", U.S. Appl. No. 13/005,122, filed Jan. 12, 2011.

McKinzie, , "Adaptive Impedance Matching Module (AIMM) Control Architectures", U.S. Appl. No. 13/293,544, filed Nov. 10, 2011.

McKinzie, , "Adaptive Impedance Matching Module (AIMM) Control Architectures", U.S. Appl. No. 13/293,550, filed Nov. 10, 2011.

McKinzie, , "Method and Apparatus for Adaptive Impedance Matching", U.S. Appl. No. 13/217,748, filed Aug. 25, 2011.

Mendolia, , "Method and Apparatus for Tuning a Communication Device", U.S. Appl. No. 13/035,417, filed Feb. 25, 2011.

Paratek Microwave, Inc., , "Method and Appartus for Tuning Antennas in a Communication Device", International Application No. PCT/US11/59620; Filed Nov. 7, 2011.

Patent Cooperation Treaty, , "International Search Report and Written Opinion", International Application No. PCT/US2010/046241, Mar. 2, 2011.

Patent Cooperation Treaty, , "International Search Report and Written Opinion", International Application No. PCT/US2010/056413, Jul. 27, 2011.

Patent Cooperation Treaty, , "International Search Report and Written Opinion", Nov. 16, 2011, International Application No. PCT/US/2011/038543.

Payandehjoo, Kasra , "Novel Techniques for Coupling Reduction in Multi-Antenna Hand-held Devices", IEEE Student Member, 1-8.

Pervez, N.K. , , "High Tunability barium strontium titanate thin films for RF circuit applications", Applied Physics Letters, 2004 American Institute of Physics.

Petit, Laurent , "MEMS—Switched Parasitic-Antenna Array for Radiation Pattern Diversity", IEEE Transactions on Antennas and Propagation, vol. 54, No. 9, Sep. 2009, 2624-2631.

Qiao, et al., "Antenna Impedance Mismatch Measurement and Correction for Adaptive COMA Transceivers", IEEE, 2005.

Qiao, et al., "Measurement of Antenna Load Impedance for Power Amplifiers", The Department of Electrical and Computer Enginneering, University of California, San Diego, Sep. 13, 2004.

Spears, , "Methods for Tuning an Adaptive Impedance Matching Networks With a Look-up Table", U.S. Appl. No. 13/297,951, filed Nov. 16, 2011.

Stemmer, Susanne , "Low-loss tunable capacitors fabricated directly on gold bottom electrodes", University of California Postprints 2006.

Taylor, T.R. , "Impact of thermal strain on the dielectric constant of sputtered barium strontium titanate thin films", Applied Physics Letters, 2002 American Institute of Physics.

Tombak, Ali , "Tunable Barium Strontium Titanate Thin Film Capacitors for RF and Microwave Applications", IEEE Microwave and Wireles Components Letters, vol. 12, Jan. 2002.

Xu, Hongtao , "Tunable Microwave Integrated Circuits using BST Thin Film Capacitors with Device", Integrated Ferroelectrics, Department of Electrical Engineering and Computer Engineering, University of California, 2005.

Zuo, S. , "Eigenmode Decoupling for Mimo Loop-Antenna Based on 180 Coupler", Progress in Electromagnetics Research Letters, vol. 26, 2011, 11-20.

Eiji, N., "High-Frequency Circuit and Its Manufacture", Patent Abstracts of Japan, vol. 1998, No. 13, Nov. 30, 1998 & JP 10 209722 A (Seiko Epson Corp), Aug. 7, 1998.

Katsuya, K., "Hybrid Integrated Circuit Device", Patent Abstracts of Japan, Publication No. 03-276901, Date of publication of application: Sep. 12, 1991.

\* cited by examiner

TECHNIQUES FOR IMPROVED ADAPTIVE IMPEDANCE MATCHING

CROSS REFERENCE TO RELATED APPLICATIONS

This application is a continuation of U.S. patent application Ser. No. 11/789,015 filed Apr. 23, 2007 by Manssen et al., entitled "TECHNIQUES FOR IMPROVED ADAPTIVE IMPEDANCE MATCHING", which is incorporated herein by reference in its entirety.

One function of an adaptive impedance matching module may be to tune the network to optimize an RF matching network. Optimization may include, but is not limited to maximizing power added efficiency (PAE), minimizing distortion and/or maximizing output power, among other things.

One of the important engineering specifications of an impedance matching control system is the dynamic range of input power over which it will operate. Additional engineering concerns prevalent with impedance matching may include the need for increased performance of the network and/or to enable it to perform in systems that might otherwise make it difficult for 10 the system to make all the required system specifications. Although not limited in this respect, GSM, EDGE and WCDMA systems have specifications limiting the allowable phase shifts within a transmit burst. Additionally, all cellular handsets have SAR (specific absorption rate) limits dictating how much RF energy may be absorbed by human bodies in close proximity. There are soon to be specifications that will dictate TRP (total radiated power) to be transmitted by cellular handsets, and handset suppliers will need to meet these specifications within a small number of transmit bursts (in a TDMA system) or in a very short period of time (in a 5 continuous transmission system). Thus, a strong need exists for techniques for improved adaptive impedance matching.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
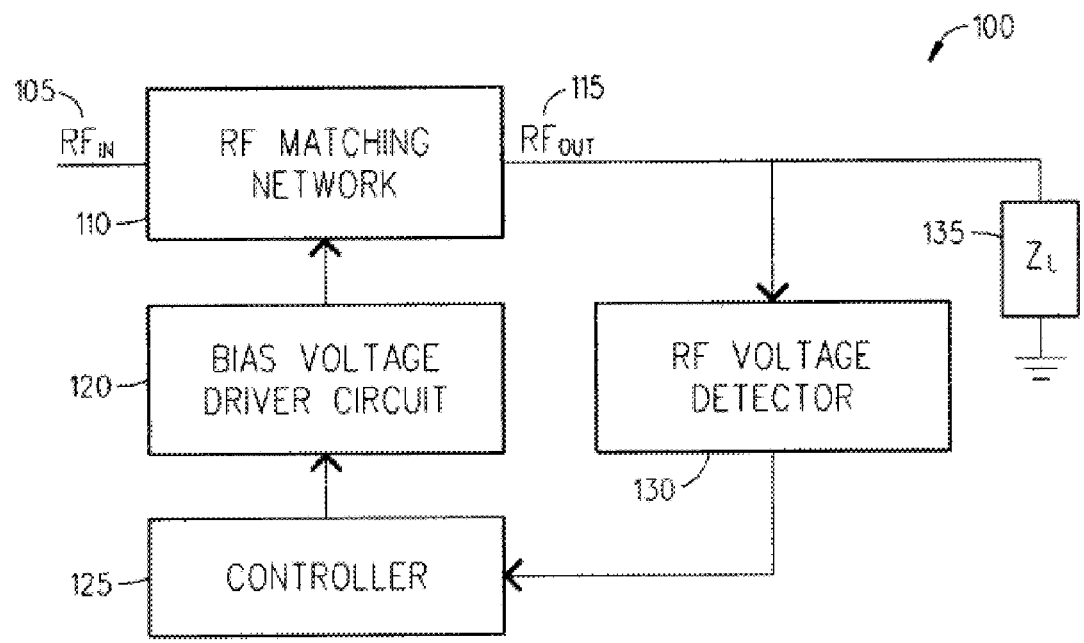
FIG. 1 illustrates a block diagram of an adaptive impedance matching module AIMM control system of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPRO Ms), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of 10 hardware (discrete or integrated circuits) and software.

Use of the terms "coupled" and "connected", along with their derivatives, may be used. It should be understood that these terms are not intended as synonyms for each other.

Rather, in particular embodiments, "connected" may be used to indicate that two or more elements are in direct physical or electrical contact with each other.' "Coupled" may be used to indicate that two or more elements are in either direct or indirect (with other intervening elements between them) physical or electrical contact with each other, and/or that the two or more elements co-operate or interact with each other (e.g. 'as in a cause an effect relationship).

An embodiment of the present invention provides closed-loop control of an adaptive impedance matching module (AIMM). The RF output node voltage of the AIMM tuner circuit may be monitored and maximized to insure the best available impedance match to arbitrary load impedance. In addition, improvement in dynamic range may be achieved by adaptively changing the RF coupling level between the voltage sensed at the output port (antenna side) of the matching network and the voltage provided to the detector. This coupling level may be controlled by a processor which also does the• closed loop tuning. Another means of realizing variable coupling levels is to digitally switch between different tap points in a series string of variable capacitors which form a shunt voltage tunable dielectric capacitor at the output node of the AIMM timer.

A typical function of an adaptive impedance matching module (AIMM) is to adaptively maximize the RF power transfer from its input port to an arbitrary load impedance $Z_L$ where the load changes as a function of time. Turning now to the figures, FIG. 1, shown generally as 100, is an AIMM block diagram.

The RF matching network 110 may contain inductors and capacitors required to transform the arbitrary load impedance $Z_L$ 135 to an impedance equal to or close to a defined system impedance, such as 50 ohms. The net benefit of this transformation is an improvement in the level of power transferred to the load $Z_L$ 135, and a reduction in the level of reflected power from the RF input port 105. This second benefit is also known as an improvement in the input mismatch loss.

The RF matching network 110 may contain one or more variable reactive elements which are voltage controlled. The variable reactive elements may be, although are not required to be, variable capacitances, variable inductances, or both. In general, the variable capacitors may be semiconductor varactors, MEMS varactors, MEMS switched capacitors, ferro-electric capacitors, or any other technology that implements a variable capacitance. The variable inductors may be switched inductors using various types of RF switches including MEMS-based switches. The reactive elements may be current controlled rather than voltage controlled without departing from the spirit and scope of the present invention.

In an embodiment of the present invention, the variable capacitors of the RF matching network may be tunable integrated circuits, such as voltage variable capacitors (e.g., voltage tunable dielectric capacitors or Parascan® Tunable Capacitors (PTCs)). Each tunable capacitor may be realized as a series network of capacitors which are all tuned using a common tuning voltage.

The RF voltage detector 130 may be comprised of a diode detector, a temperature compensated diode detector, a logarithmic amplifier, or any other means to detect an RF voltage magnitude. The phase of the RF voltage is not required. The controller 125 accepts as an input the information associated with the detected RF output 115 voltage. The controller 125 provides one or more outputs that control the bias voltage driver circuits. The controller 125 may be digitally-based such as a microprocessor, a digital signal processor, or an ASIC, or any other digital state machine. The controller may also be an analog-based system.

The bias voltage driver circuit 120 is a means of mapping control signals that are output from the controller 125 to a voltage range that is compatible with the tunable reactive elements in the RF matching network 110. The driver circuit may be an application specific integrated circuit (ASIC) whose function is to accept digital signals from the controller 125 and then output one or more analog voltages for one or more tunable reactive elements in the RF matching circuit 110. The driver circuit 120 may provide a wider range of analog tuning voltages than what is used as a power supply voltage by the controller 125. Hence the driver circuit 120 may perform the functions of voltage translation and voltage scaling.

The purpose of the control system shown in FIG. 1 is to monitor the output RF voltage magnitude and to use this information as an input to an algorithm that adjusts the tuning voltages provided to the tunable reactive elements in the RF matching network 110. The algorithm adjusts the reactances to optimize an RF output 115 voltage. Various options exist for control algorithms. In general, the algorithm may be a scalar multi-dimensional maximization algorithm where the independent variables are the tuning voltages for the reactive elements. Some embodiments of the operation of the tuning algorithm of the present invention, may increase performance of a network and/or enable it to perform in systems that might otherwise make it difficult for the system to make all the required system specifications. GSM, EDGE and WCDMA systems have specification limiting the allowable phase shifts within a transmit burst. Additionally, all cellular handsets have SAR (specific absorption rate) limits dictating how much RF energy may be absorbed by human bodies in close proximity. There are soon to be specifications that will dictate TRP (total radiated power) to be transmitted by cellular handsets, and handset suppliers will need to meet these specifications within a small number of transmit bursts (in a TDMA system) or in a very short period of time (in a continuous transmission system).

In an embodiment of the present invention, in order to achieve the above objectives, the AIMM tuning algorithm may include:

1—Limit the number of tuning "steps" that are taken within a transmit burst or limit the magnitude of each step taken within a transmit burst, or limit the steps to only be allowed between bursts (when the transmitter is disabled). This can be accomplished by putting time delays in the algorithm, or to only allow tuning only when the transmitter is inactive.

2—Limit the allowed tuning to avoid certain matching impedances, or put the tuner in a "default" position when the cellular handset transmitter is at the full power step. By doing so at the highest power level, the present invention may avoid having the handset antenna couple higher power into the human tissue near the phone's antenna. It is at predetermined power levels based upon usage, user and handset characteristics that the SAR limit typically becomes a factor, and by limiting the effectiveness of the AIMM tuner at these predetermined power levels based upon various handsets with various uses and in various usages scenarios, the present invention can avoid the possibility of causing the handset to exceed the SAR limits.

Embodiments of the present invention may be incorporated into various particular handsets. As handsets and use parameters vary, SAR characteristics will vary and therefore usage parameters may be developed. These usage parameters may be used to determine what power stops could exceed the SAR standards and therefore which algorithms of the present invention may be used most appropriately. Then at those power steps one can implement a default limit. Therefore, an embodiment of the present invention will not let the apparatus go past this amount of tuning. Through characterization a handset manufacture may determine handset characteristics to enable the best use and settings for the present invention to ensure the SAR limit is not exceeded. Thus, by characterizing specific phones with specific use and user scenarios, it is possible to set the present invention to match that particular instantiation.

Figure 6:
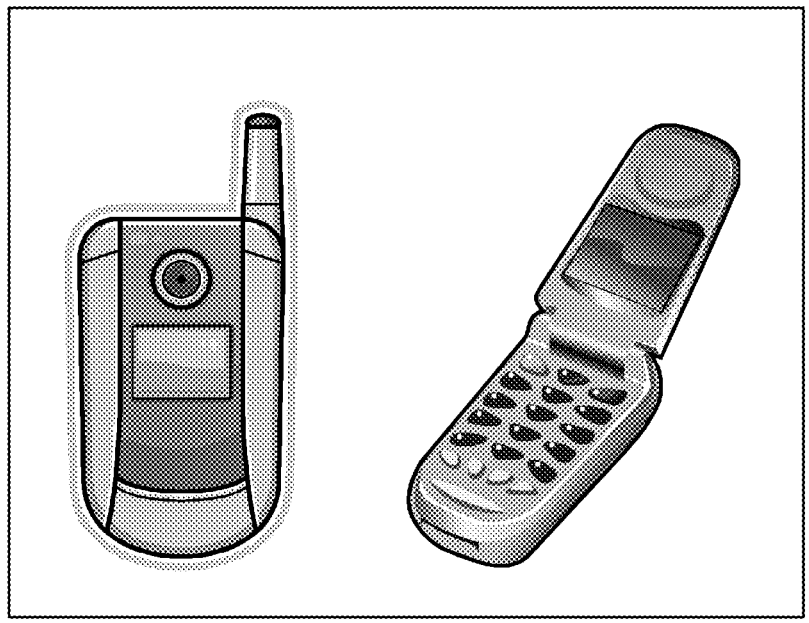
FIG. 6 shows an embodiment of a flip phone.

3—In order to allow the adaptive impedance matching module (AIMM) tuner to achieve the optimal match as quickly as possible, a memory system could be engaged in which the optimal match is stored for each frequency band, or perhaps even for each group of channels, and this memorized optimal match is used as the starting position any time the phone is directed to that particular band or channel. This memory could also remember operating positions of the aforementioned phone such as flip-open or flip-closed of an illustrative flip phone shown in FIG. 6 in order to better predict the best starting position for the matching network.

Figure 2:
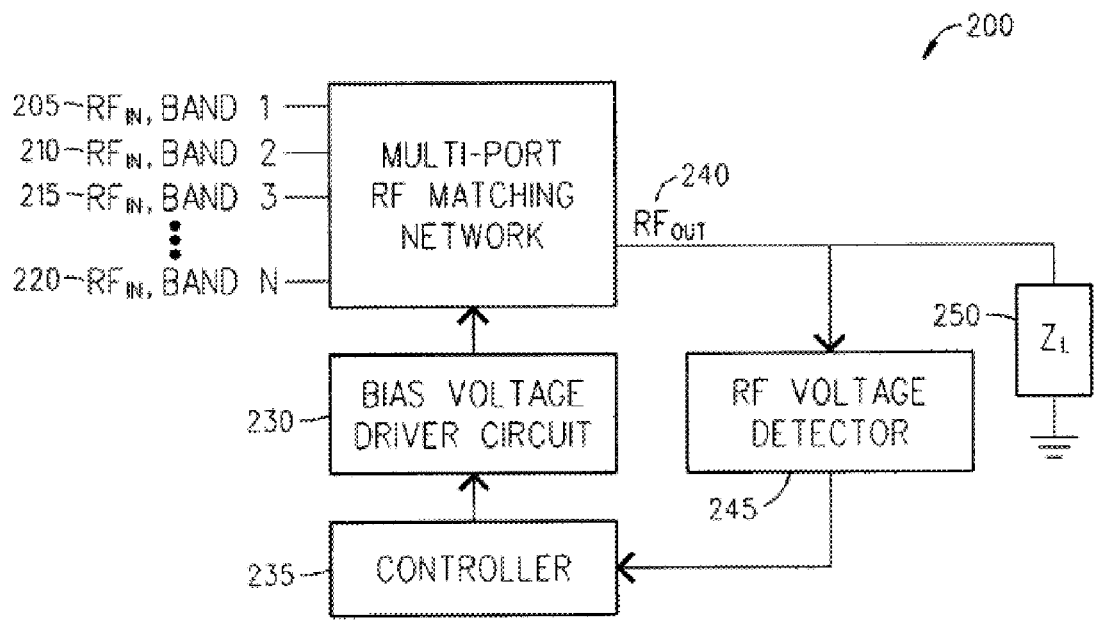
FIG. 2 illustrates a control system for a multi-port adaptive impedance matching module of one embodiment of the present invention.

A simplified control system that the present invention may be utilized in is shown in FIG. 1 and is illustrated using a 2 port RF matching network. However, this control system is extensible to multi-port RF matching networks as shown in FIG. 2, generally as 200. Consider a RF multiplexing filter with N input ports where each port is designed for a specific band of frequencies. Assume that N transmitters drive the N input ports 205, 210, 215 and 220, and that each input port is coupled to the single RF output port 240 using RF circuits that contain variable reactive elements. The objective of the control system remains the same, to optimize an RF matching network for RF transmissions, and thus to optimize the power transfer from the nth input port to the arbitrary load impedance. Further, the RF voltage detector 245, controller 5 235 and bias voltage driver circuit 230 functions as described above with reference to FIG. 1 and in the embodiment of FIG. 2, the RF matching networks is a multi-port RF matching network 225.

Although the present invention is not limited in this respect, the arbitrary load impedance $Z_L$ 250 may be a multi-band antenna in a mobile wireless device and the multi-port matching network 225 may be a diplexer whose function is to route the signal between two or more paths by virtue of the signal frequency and under the control of the handset logic; hand controller or processor.

Figure 3:
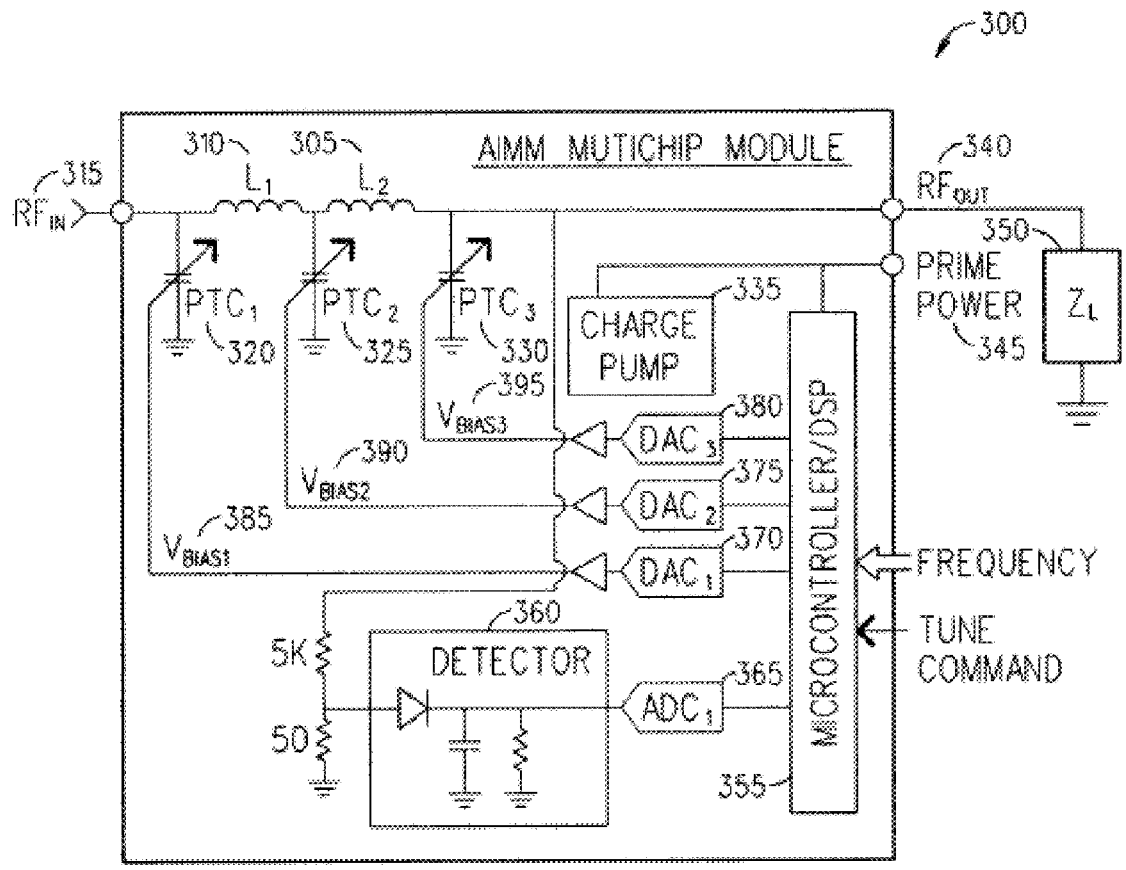
FIG. 3 shows an implementation of an AIMM closed loop control system of one embodiment of the present invention.

Looking now at FIG. 3, the variable capacitors (such as, but not limited to, PTCs) 320, 325 and 330 and inductors 305 and 310 may be built into a multichip module 300 containing a detector 360, an ADC 365, a processor 355, DACs 370, voltage buffers, and charge pump 335. This multichip module 300 may be designed with a closed loop feedback system to maximize the RF voltage across the output node by• adjusting. all the PTC 320, 325 and 330 bias voltages, and doing so independently.

In an embodiment of the present invention as provided in FIG. 3, the RF matching network may be comprised of inductors $L_1$ 310, $L_2$ 305 and variable capacitors $PTC_1$ 320, $PTC_2$ 325 and $PTC_3$ 330. Note that each variable capacitor may itself be a complex network. The RF voltage detector 360 in this AIMM may be comprised of a resistive voltage divider (5KΩ/5Ω) and the simple diode detector. In an embodiment of the present invention, the controller may be comprised of the analog-to-digital converter or $ADC_1$ 355, the microprocessor 355, plus the digital-to-analog converters $DAC_1$ 370, $DAC_2$ 375 and $DAC_3$ 380. The controller may use external signals such as knowledge of frequency, Tx or Rx mode, or other available signals in the operation of its control algorithm. The bias voltage driver circuit may be comprised of a DC-to DC converter such as the charge pump 335, in addition to the three analog buffers whose output voltage is labeled $V_{bias1}$ 385, $V_{bias2}$ 390, and $V_{bias3}$ 395. The DC-to-DC voltage converter may be needed to supply a higher bias voltage from the analog buffers than what is normally required to power the processor 355. The charge pump may supply a voltage in the range of 10 volts to 50 volts, and in some embodiments, both positive and negative supply voltages may be used.

It should be noted that the RF matching network shown in FIG. 2 is representative of many possible circuit topologies. Shown in FIG. 2 is a ladder network, but other topologies such as a T or Pi network may be used. The variable reactive elements (capacitors) are shown in shunt connections but that is not a restriction, as they may be used in series in other applications. Furthermore, three independent variable capacitances are shown in this RF matching network. However, fewer or more variable reactive elements may be used depending on the complexity needed to meet RF requirements.

In FIG. 3, the inductors for the RF matching network are shown to be included in the AIMM multichip module. In practice, this may not always be the case. If the module is extremely small, it may be more convenient to use external inductors for the matching network. External inductors may have a higher Q factor than smaller inductors that are able to be integrated on the module.

One of the important engineering specifications of the simplified AIMM control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher.

Figure 4:
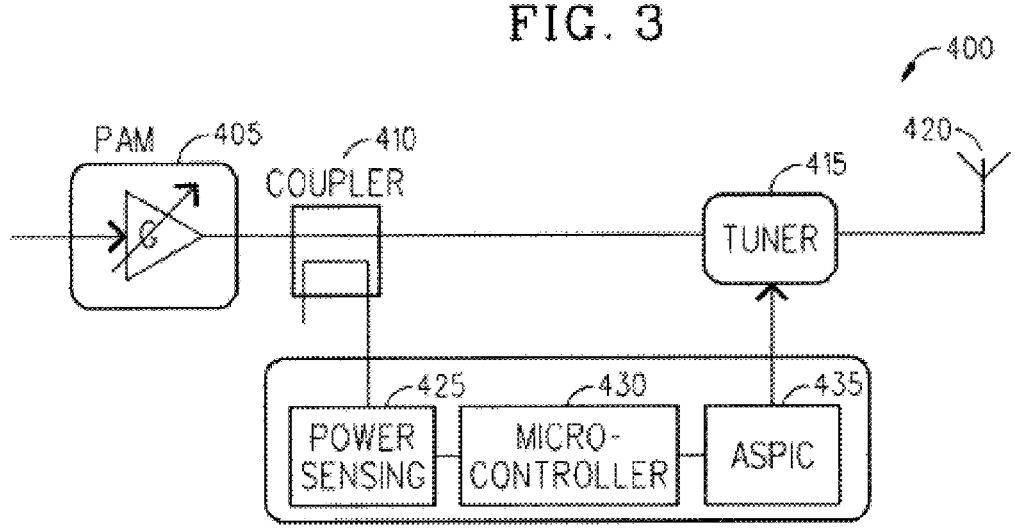
FIG. 4 is a illustrates an apparatus adapted to enable coupling for closed loop transmit power measurements of an embodiment of the present invention.

Looking now at FIG. 4 is a transmitter 400, that may benefit from the algorithm of the present invention, a tuner 415 capable of tuning antenna 420 associated with the transmitter 400, a power detector 425 adapted to acquire information about transmit power. Further, a power amplifier module (PAM) 405 may be coupled via a coupler 410 to a tuner 415 and further coupled to a power sensor 425, the power sensor 425 may provide power information to a micro-controller 430 connected to an application specific programmable integrated circuit (ASPIC) 435 which controls the tuner 415 for tuning the tunable antenna 420.

Equally important as enhancing the dynamic range is improving the output harmonics and IP3 of the module. The variable voltage divider 550 will allow the detector input port 505 to be more isolated at the higher power levels. This will improve linearity of the module for high signal levels.

Figure 5:
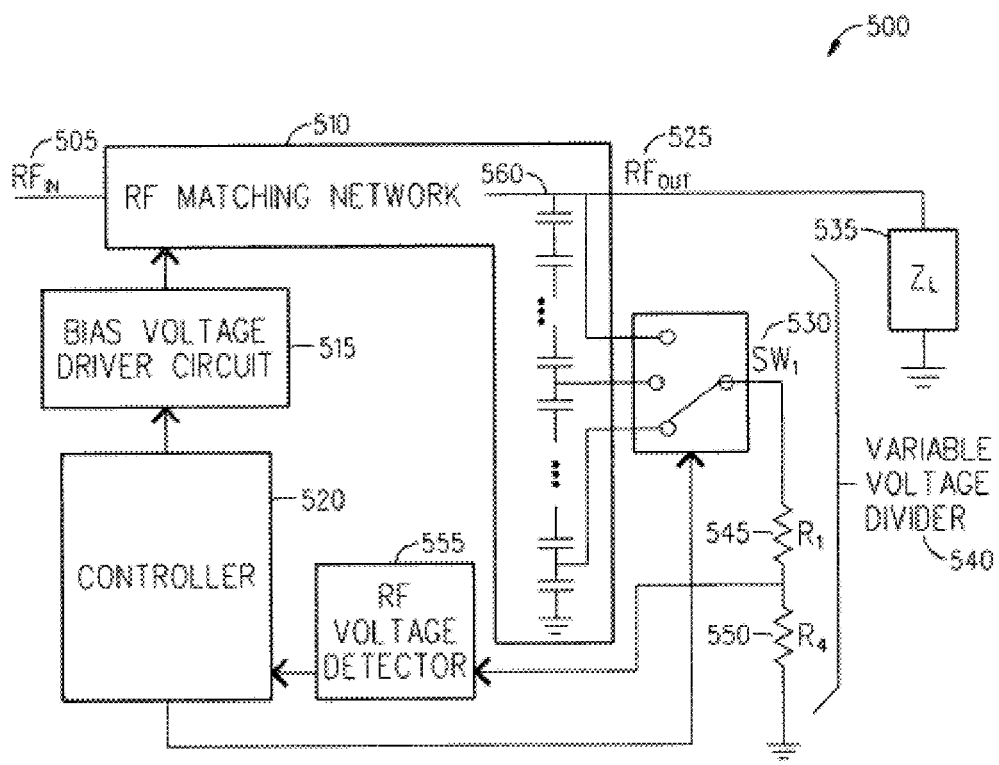
FIG. 5 shows a second embodiment of an enhanced dynamic range AIMM control system.

Turning now to FIG. 5, generally at 500 are the functional blocks of a variable voltage divider 540, and the RF matching network 510 may be combined in hardware to some degree by understanding that the output node 525 of the matching network 510 may be connected to a shunt RF branch comprised of a series string of capacitors 560 and to impedance 535. An input node for $RF_{in}$ 505 may also be connected to the RF matching network 510. This series string 560 may be a RF voltage divider 540, and by selectively tapping into various circuit nodes along the string, one may obtain a variable output voltage divider 540. In an embodiment of the present invention, this is done with a digitally controlled RF switch 530. The switch 530 may be realized with FETs•, MEMS, PIN diodes, or any other RF switch technology. Associated with variable voltage divider 540 is RF voltage detector 555 and controller 520, which is further connected to RF matching network 510 via bias voltage driver circuit 515.

As a practical matter, the resistance of R1 545 will need to be much higher (>10×) than the reactance of the string of series capacitors 560 between the tap point and ground. An alternative circuit to FIG. 5 would have the resistor R) 545 moved to the capacitor side of the switch SW$_1$ 530 and placed in each of the three lines going to the tap points. This will allow the resistors to be built on-chip with the tunable IC used in the matching network. Resister R4 may also be utilized at 550.

Some embodiments of the invention may be implemented, for example, using a machine-readable medium or article which may store an instruction or a set of instructions that, if executed by a machine, for example, by the system of FIG. 1 or FIG. 2, by controller 125 and 235 in communication with bias voltage driver circuit 120 and 230, by processor 355 of FIG. 3, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM) Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object oriented, visual, compiled and/or interpreted programming language, e.g., C, C++, Java, BASIC, Pascal, Fortran, Cobol, assembly language, machine code, or the like.

An embodiment of the 'present invention provides a machine-accessible medium that provides instructions, which when accessed, cause a machine to perform operations comprising connecting an RF matching network to at least one RF input port and at least one RF output port and including one or more voltage or current controlled variable reactive elements, tuning the RF matching network to optimize the RF matching network for RF transmissions bursts and limiting tuning steps to be between the transmission bursts. The machine-accessible medium .of the present invention may further comprise the instructions causing the machine to perform operations further comprising connecting an RF matching network to at least one RF input port and at least one RF output port and including one or more voltage or current controlled variable reactive elements, tuning the RF matching network to optimize the RF matching network and limiting the tuning to avoid certain matching impedances at predetermined parameters.

Lastly, the machine-accessible medium of the present invention may further comprise the instructions causing the machine to perform operations further comprising connecting an RF matching network to at least one RF input port and at least one RF output port and including one or more voltage or current controlled variable reactive elements, tuning the RF matching network to optimize the RF matching network and storing in memory an optimal impedance match for each frequency band or each group of channels to enable an optimal tuning starting position for a given band or channel.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Throughout the aforementioned description, BST may be used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material.

While the present invention has been described in terms of what are at present believed to be its preferred embodiments, those skilled in the art will recognize that various modifications to the disclose embodiments can be made without departing from the scope of the invention as defined by the following "claims.

The invention claimed is:

1. An apparatus, comprising:
   an RF matching network comprising one or more variable reactive elements,
   wherein the RF matching network is tuned to adapt to a change in impedance of a variable load, wherein the tuning for each tuning step is limited within a range up to a pre-determined magnitude for each tuning step initiated during a transmit burst to reduce an undesirable effect that would result in a failure to comply with a transmission specification and that would have occurred based on a transmitted signal if an unconstrained magnitude for each of the tuning steps had been utilized, wherein the transmission specification provides signal specifications for transmission of RF signals in a communication system, and wherein the tuning is initiated from an initial tuning state of the one or more variable reactive elements where the initial tuning state is selected based on a use case of a communication device housing the RF matching network.

2. The apparatus of claim 1, wherein a portion of the tuning takes place between transmission bursts while the transmitter is inactive, 3. The apparatus of claim 1, wherein the transmission specification is promulgated by an entity and includes allowable phase shifts within the transmit burst, and wherein each tuning step is limited by the allowable phase shifts.

4. The apparatus of claim 1, comprising a controller that detects the impedance change of the variable load impedance.

5. The apparatus of claim 4, comprising a controller that utilizes time delays for tuning the matching network while radiating an RF signal.

6. The apparatus of claim 5, wherein the tuning is limited to a pre-determined number of the tuning steps.

7. The apparatus of claim 1, wherein the one or more variable reactive elements comprise a semiconductor varactor.

8. The apparatus of claim 1, wherein the one or more variable reactive elements comprise a micro-electromechanical systems varactor.

9. The apparatus of claim 1, wherein the one or more variable reactive elements comprise a micro-electromechanical systems switched reactance component.

10. The apparatus of claim 1, wherein the one or more variable reactive elements comprise a semiconductor switched reactance component.

11. The apparatus of claim 1, wherein the one or more variable reactive elements comprise a variable dielectric capacitor.

12. The apparatus of claim 5, wherein the tuning utilizes variable increments.

13. An apparatus comprising:
an RE matching network including one or more variable reactive elements,
wherein the RE matching network is tuned to adapt to a change in impedance of a variable load impedance, wherein the tuning is limited to a predetermined number of tuning steps that are taken during a transmit burst to limit an undesirable effect that would result in a failure to comply with a transmission specification and that would have occurred based on a transmitted signal if an unconstrained number of tuning steps had been utilized, wherein the transmission specification provides signal specifications for transmission of RE signals in a communication system, wherein the tuning utilizes variable increments, wherein the tuning is accomplished by varying a voltage or current applied to the one or more variable reactive elements, wherein the tuning is initiated from an initial tuning state of the one or more variable reactive elements where the initial tuning state is selected based on a use case of a communication device housing the RF matching network, and wherein the one or more variable reactive elements comprise at least one of semiconductor varactors, micro-electro-mechanical systems (MEMS) varactors, MEMS switched reactance components, semiconductor switched reactance components, variable dielectric capacitors, or combinations thereof.

14. The apparatus of claim 13, wherein the transmission specification is promulgated by an entity and includes allowable phase shifts within the transmit burst, wherein each tuning step is limited by the allowable phase shifts.

15. The apparatus of claim 13,
wherein the tuning is limited by avoiding a matching impedance corresponding to a specific absorption rate threshold.

16. The apparatus of claim 13, wherein the tuning is adapted to be placed in a default position when the apparatus is a cellular handset transmitter operating at any predetermined power step.

17. The apparatus of claim 13, further comprising a memory that is adapted to provide an initial operating impedance for the RF matching network, wherein the initial operating impedance is used as a starting point for an algorithm to control operations of the RF matching network.

18. The apparatus of claim 13, wherein the RF matching network comprises at least one of semiconductor varactors, micro-electro-mechanical systems (MEMS) varactors, MEMS switched reactance components, semiconductor switched reactance components, or variable dielectric capacitors.

19. A non-transitory machine-readable storage medium, comprising computer instructions which, responsive to being executed by a processor, cause the processor to perform operations comprising:
detecting an impedance change of a variable load impedance; and
tuning a variable reactance network coupled to the variable load impedance by utilizing at least one of a predetermined number of tuning steps or magnitude-limited tuning steps that are limited within a range up to a predetermined magnitude for each of the tuning steps, wherein the utilization of the at least one of the predetermined number of tuning steps or the magnitude-limited tuning steps reduces an undesirable effect that would result in a failure to comply with a transmission specification and that would have occurred based on an RF signal if an unconstrained magnitude for each of the tuning steps or an unconstrained number of tuning steps had been utilized, wherein the transmission specification provides signal specifications for transmission of RF signals in a communication system, wherein the tuning is initiated from an initial tuning state of one or more variable reactive elements of the RF matching network where the initial tuning state is selected based on a use case of a communication device housing the RF matching network.

20. The non-transitory machine-readable storage medium of claim 19, wherein the tuning utilizes variable increments.

21. The non-transitory machine-readable storage medium of claim 19, wherein the variable reactance network comprises at least one of semiconductor varactors, micro-electromechanical systems (MEMS) varactors, MEMS switched reactance components, semiconductor switched reactance components, or variable dielectric capacitors.

22. The non-transitory machine-readable storage medium of claim 19, wherein the variable reactance network comprises a semiconductor varactor.

23. The non-transitory machine-readable storage medium of claim 19, wherein the variable reactance network comprises a micro-electro-mechanical systems varactor.

24. The non-transitory machine-readable storage medium of claim 19, wherein the variable reactance network comprises a micro-electro-mechanical systems switched reactance component.

25. The non-transitory machine-readable storage medium of claim 19, wherein the variable reactance network comprises a semiconductor switched reactance component.

26. The non-transitory machine-readable storage medium of claim 19, wherein the variable reactance network comprises a variable dielectric capacitor.

27. A method comprising:
detecting, by a processor, an impedance change of a variable load impedance; and
tuning, by the processor, a variable reactance network coupled to the variable load impedance by utilizing at least one of a predetermined number of tuning steps or magnitude-limited tuning steps that are limited within a range up to a predetermined magnitude for each of the tuning steps, wherein the utilization of the at least one of the predetermined number of tuning steps or the magnitude-limited tuning steps reduces an undesirable effect that would result in a failure to comply with a transmission specification and that would have occurred based on an RF signal if an unconstrained magnitude for each of the tuning steps or an unconstrained number of tuning steps had been utilized, wherein the transmission specification provides signal specifications for transmission of RF signals in a communication system, wherein the tuning is initiated from an initial tuning state of one or more variable reactive elements of the RF matching network where the initial tuning state is selected based on a use case of a communication device housing the RF matching network.

28. A method comprising:

detecting, by a processor, an impedance change of a variable load impedance; and tuning, by the processor, an RF matching network to adapt to the impedance change, wherein the tuning for each tuning step is limited within a range up to a pre-determined magnitude for each tuning step initiated during a transmit burst to reduce an undesirable effect that would result in a failure to comply with a transmission specification and that would have occurred based on a transmitted signal if an unconstrained magnitude for each of the tuning steps had been utilized, wherein the transmission specification provides signal specifications for transmission of RF signals in a communication system, and wherein the tuning is initiated from an initial tuning state of one or more variable reactive elements of the RF matching network where the initial tuning state is selected based on a use case of a communication device housing the RF matching network.

29. A method comprising:

detecting, by a processor, an impedance change of a variable load impedance; and tuning, by the processor, an RF matching network to adapt to the impedance change, wherein the tuning is limited to a predetermined number of tuning steps that are taken during a transmit burst to limit an undesirable effect that would result in a failure to comply with a transmission specification and that would have occurred based on a transmitted signal if an unconstrained number of tuning steps had been utilized, wherein the transmission specification provides signal specifications for transmission of RF signals in a communication system, wherein the tuning utilizes variable increments, wherein the tuning is accomplished by varying a voltage or current applied to one or more variable reactive elements of the RF matching network, wherein the tuning is initiated from an initial tuning state of the one or more variable reactive elements where the initial tuning state is selected based on a use case of a communication device housing the RF matching network, and wherein the one or more variable reactive elements comprise at least one of semiconductor varactors, micro-electro-mechanical systems (MEMS) varactors, MEMS switched reactance components, semiconductor switched reactance components, variable dielectric capacitors, or combinations thereof.

* * * * *